(12) United States Patent  
Charron

(10) Patent No.: US 6,672,955 B2
(45) Date of Patent: Jan. 6, 2004

(54) AIR FLOW MANAGEMENT SYSTEM FOR AN INTERNET DATA CENTER

(75) Inventor: Frederic Charron, Villeneuve-Loubet (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/233,956

(22) Filed: Sep. 3, 2002

(65) Prior Publication Data

US 2003/0050003 A1 Mar. 13, 2003

(30) Foreign Application Priority Data

Sep. 7, 2001 (EP) .............................................. 1480083

(51) Int. Cl.[7] ................................................ H05K 5/00
(52) U.S. Cl. ........................ 454/184; 361/691; 361/696
(58) Field of Search .......................... 454/184; 361/678, 361/691, 695, 696

(56) References Cited

U.S. PATENT DOCUMENTS 5,345,779 A * 9/1994 Feeney ....................... 62/259.2
6,034,873 A * 3/2000 St.ang.hl et al. ............. 361/701
6,119,768 A * 9/2000 Dreier et al. ........... 165/104.33
6,483,700 B1 * 11/2002 Malone et al. ............... 361/690
6,574,104 B2 * 6/2003 Patel et al. ................... 361/695

* cited by examiner

Primary Examiner—Gregory Wilson
(74) Attorney, Agent, or Firm—John R. Pivnichny; David R. Irvin

(57) ABSTRACT

An air flow management system for an Internet Data Center with rows of cabinets, the rows being located on an elevated floor and disposed in pairs wherein the front sides of the two rows face each other. Fresh air is supplied through the elevated floor in order to cool the heat generating elements, and collected after passing through the heat generating elements. The tops of the two front sides of the two rows in each pair of rows are joined by a cover so that the front sides and the cover constitute a tunnel. The volume of fresh air supplied through the elevated floor is controlled by openings whereby the static pressure in each tunnel can be controlled depending upon the heat generated.

9 Claims, 3 Drawing Sheets

AIR FLOW MANAGEMENT SYSTEM FOR AN INTERNET DATA CENTER

TECHNICAL FIELD

The present invention relates to Internet Data Centers used as server farms wherein it is necessary to cool heat-generating elements and relates in particular to an air flow management system for an Internet Data Center.

BACKGROUND

An Internet Data Center (IDC) is a room wherein server farms with rows of cabinets side by side in very large numbers are located. The cabinets include data processing elements which generate heat. Accordingly, they need to be cooled by locating the cabinets on perforated tiles of an elevated floor having cool air supplied under the tiles. The openings in the tiles, perforated cabinet fronts and rear doors are today the fundamental means of cooling the heat-generating elements stored in each cabinet. By controlling the flow of the fresh air and the size of the various tile openings, the airflow through the door and therefore the temperature in the cabinet may be controlled. To improve the heat dissipation of each element, the cabinet may be equipped with its own fan that creates a forced air flow in the cabinet. However, such equipment may be not adequate to air-condition rooms that do not have enough static pressure under the elevated floor.

Often, expensive uninterruptible power systems (UPS) are installed for both the data processing elements and fan-powered cooling assemblies. Existing cabinet installations used as server farms waste available UPS power because no method exists to minimize the fan energy as a percentage of the power required to cool the critical computer and other electronic equipment installed in the cabinets.

Another problem raised in the cabinet systems wherein additional fans overcome the lack of a main fan system is that the additional fans may interfere with the fan parameters of the electronic equipment, as each unit of electronic equipment may also have its fan system, and therefore put at risk the reliability established by the manufacturers of the electronic equipment.

An important failure of today's systems is that they are not readily adjusted to the environment. Openings in the tiles are defined by design rules that do not take into account equipment specifications. Accordingly, today's systems fail to a great extent to properly control cooling capacity and static pressure, often requiring a cabinet to be unloaded and tipped for performing adjustments. Furthermore, recycling loops occur between the front side and the rear side of the cabinet rows resulting in a static pressure which is not controlled as required. Such cooling capacity problems cannot be solved because the need for continuous data and telecommunication processing prevents any interruption of the operation of the equipment. Retrofitting existing cabinets with on-line processing load is nearly impossible without risk, such a procedure relating to the cooling capacity and pressure under the elevated floor and the need to insure that each cabinet drains off minimum cooling air and produces minimum pressure drop.

SUMMARY OF THE INVENTION

Accordingly, an object of the invention is to provide an air flow management system for an Internet Data Center, wherein the static pressure of the air is easily controlled in order to avoid wasting any cooling capacity.

Another object of the invention is to provide an air flow management system for an Internet Data Center, wherein cabinets having different power loads may be located side by side without causing cooling capacity conflicts between adjacent equipment.

The invention relates therefore to an air flow management system for an Internet Data Center comprising a plurality of rows of cabinets containing heat generating elements. The rows are located on an elevated floor and disposed in pairs of rows wherein the front sides of the two rows face each other. Such a system comprises fresh air generating means for supplying fresh air through the elevated floor and hot air collecting means for collecting hot air resulting from the fresh air passing through the heat generating elements. The tops of the two front sides of the two rows in each pair of rows are joined by a cover such that the front sides and the cover constitute a tunnel. Means are included for controlling the volume of fresh air which is supplied through the elevated floor, whereby the static pressure in each tunnel can be controlled depending upon the heat generating elements of the rows in the associated pair of rows.

BRIEF DESCRIPTION OF THE DRAWINGS

The above and other objects, features and advantages of the invention will be better understood by reading the following more particular description of the invention in conjunction with the accompanying drawings wherein.

DETAILED DESCRIPTION

Figure 1:
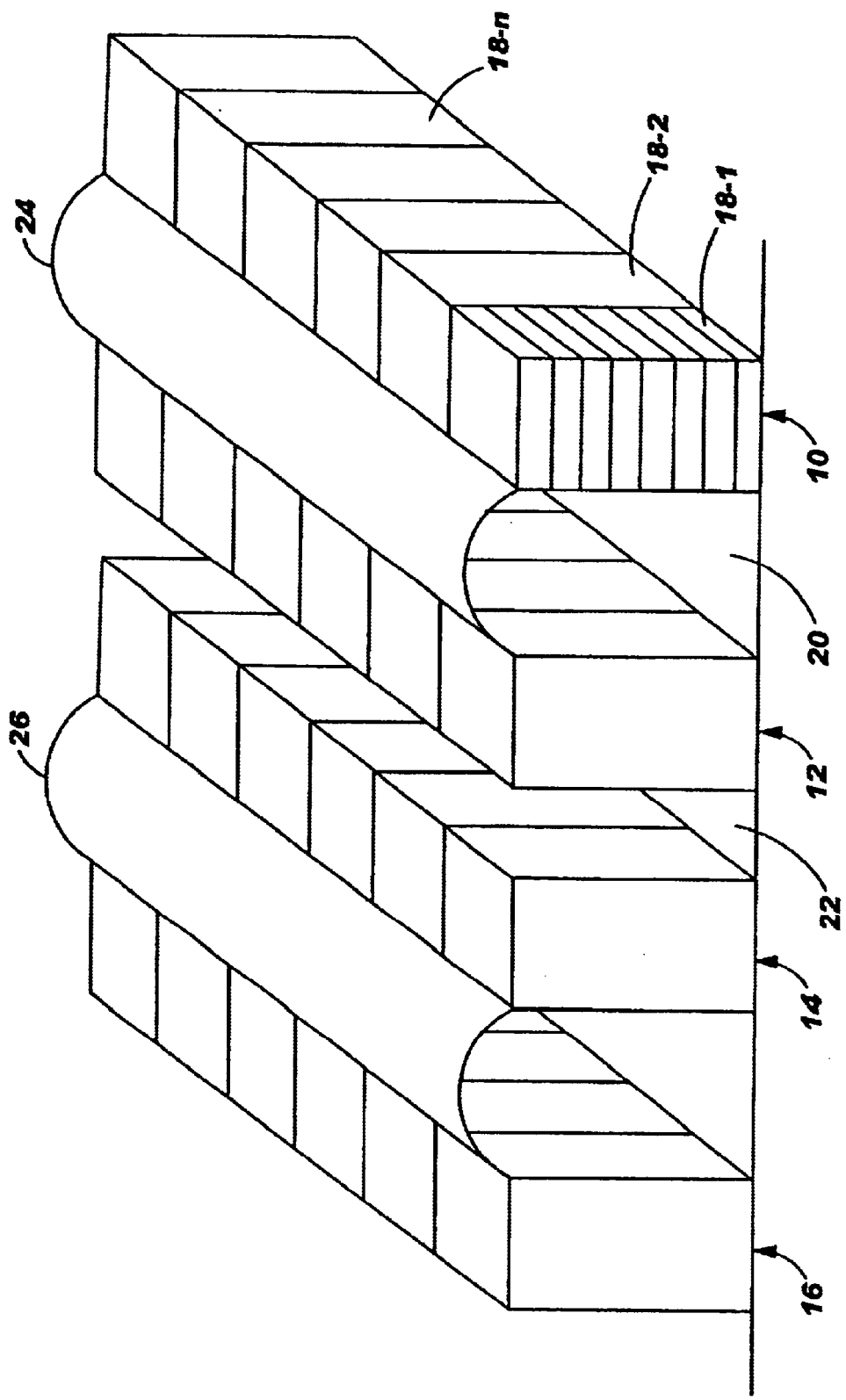
FIG. 1 is a schematic perspective view showing several rows of cabinets in an Internet Data Center.

As illustrated in FIG. 1, an Internet Data Center (IDC) includes a number of rows 10, 12, 14, 16 which are grouped in pairs of rows such as the pair of rows 10 and 12 or the pair of rows 14 and 16. The front sides of the two rows in a pair face each other. Each row comprises a plurality of adjacent cabinets, such as row 10 which comprises cabinets 18-1, 18-2 . . . 18-n. Each cabinet such as cabinet 18-1 includes data processing elements which can be server farms or parts of server farms. The space between the front sides of the rows in a pair of rows such as space 20 between rows 10 and 12 is wide enough (e.g. 1.5 m) to enable an operator to access data processing elements of the two rows, whereas the space between the rear sides of two adjacent rows in different pair of rows such as the space 22 between rows 12 and 14 may be less wide insofar as it is rarely necessary for the operator to access the rear of the data processing elements. The two rows of a pair of rows are joined by a cover such as cover 24 joining rows 10 and 12 or cover 26 joining rows 14 and 16, so that the space between the rows of the pair constitutes a tunnel. Note that the cover 24 or 26 may have different shapes, such as a dome shape, a tent shape, or a floor shape.

Figure 2:
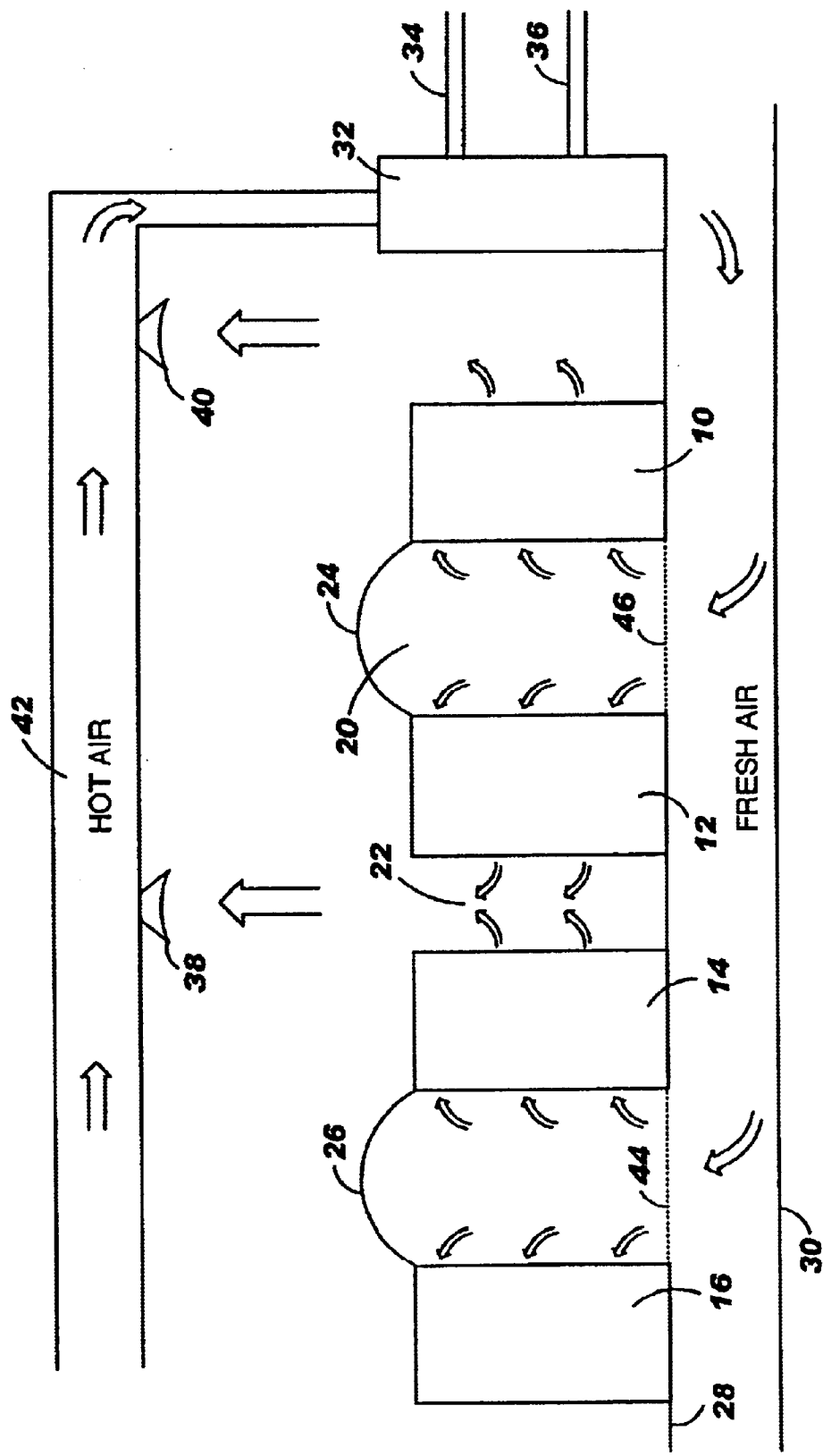
FIG. 2 is a schematic representation of an Internet Data Center with an air flow management system according to the invention.

An IDC with the air flow management system according to the invention is illustrated in FIG. 2. As illustrated, the cabinets are located on an elevated floor 28 so that there is room between this elevated floor and the normal floor 30 to enable fresh air to circulate therein. The fresh air is blown by a heat exchanger 32 wherein the air which has been heated by the equipment of the IDC transmits its calories to a cooling fluid circulating in ducts 34, 36. Hot air may be sucked by fans 38, 40 into a hot air room 42 and transmitted to the heat exchanger 32 to be transformed into fresh air.

The elevated floor 28 includes openings such as opening 44 or 46 in the part of the elevated floor between two rows of a pair of rows, enabling the fresh air blown by heat exchanger 32 to enter the tunnel constituted by the two rows and the cover joining them. This fresh air has a static pressure greater than the normal pressure, for example between 1.2 and 1.4 bars, whereas the hot air sucked by fans 34, 40 has an inferior static pressure, for example between 1.1 and 1.2 bars. Due to this difference between the static pressure in a tunnel such as tunnel 20 and the static pressure in the space between the rear sides of the cabinets such as space 22, the air flows through the cabinets; therefore, the fresh air cools the data processing elements within the cabinets. Because of the cover joining the cabinets in a pair of rows, fresh air cannot be sucked directly by the fans, but is forced to pass through the data processing elements. Furthermore, this feature enables maintenance of the static pressure of the fresh air superior to the static pressure of the hot air.

It is preferred that the controls that are responsive to temperature indicative of heating by the data processing elements be used to control the overall static pressure of the fresh air supplied to the front sides of the cabinets. As the data processing elements may be different in the different rows, different tunnels may need different volumes of fresh air.

Therefore, the tile openings in one tunnel may be different from the tile openings in another tunnel, and it is important to determine the minimum tile openings for each tunnel in order not to waste fresh air. Thus, the percentage of tile openings 44 in the tunnel between row 14 and row 16 may be 30% whereas the percentage of the tile openings 46 in the tunnel between row 10 and row 12 may be 40%. Such an arrangement provides maximum flexibility together with the ability to handle maximum as well as minimum heat loads.

In order to better adjust the tile openings according to the optimum need in a given tunnel, an alternative is to use manually operated tiles. Initially, all tiles are adjusted to provide desired cabinet operating temperatures. After a short period of time, the tiles are replaced by tiles with different percentage of openings in order to achieve efficient cooling of the tunnel while the static pressure is maintained to the same predefined value as in other tunnels. Such a result may be obtained by using tiles provided with variable openings that are adjusted manually by shutters. Note that the temperature in the cabinets is relatively stable and the change of tiles or of tile openings is not frequent.

Figure 3:
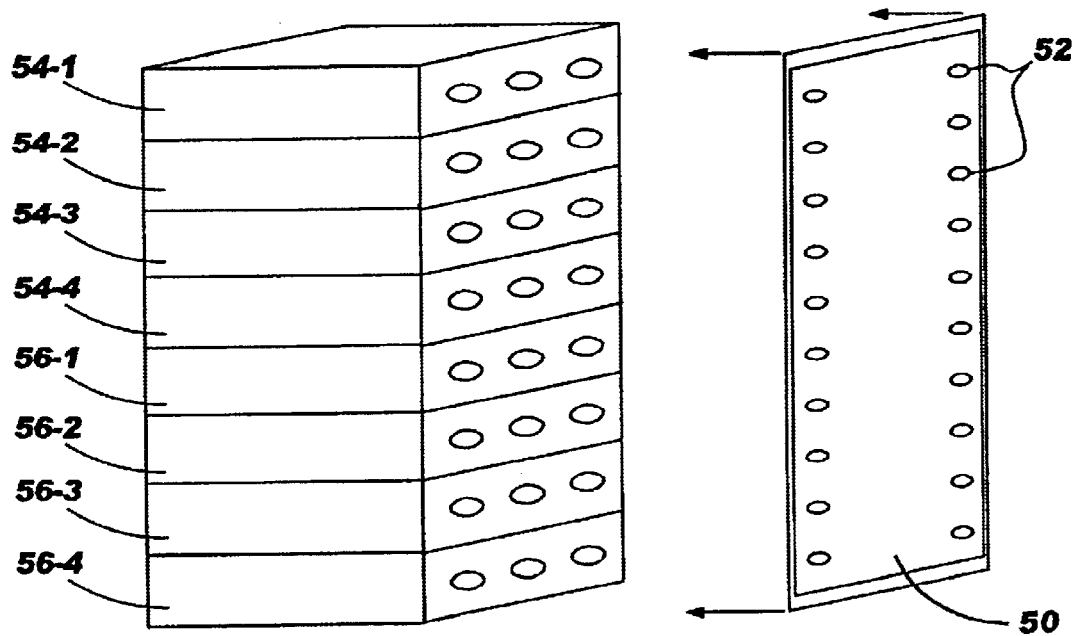
FIG. 3 is a schematic representation of a cabinet showing blank and perforated panels according to one aspect of the invention.

Another feature of the invention is illustrated in FIG. 3. Each cabinet such as cabinet 18-1 has a front door 50 including perforations 52 enabling the fresh air to penetrate the data processing elements of the cabinet. In addition to such a perforated front door, each shelf has a front panel, such a panel being a blank panel or a perforated panel. Assuming that the four top shelves 54-1 through 54-4 contain data processing elements and the other shelves 56-1 through 56-4 do not, the top shelves 54-1 through 54-4 are provided with perforated front panels that allow air to flow freely, whereas the four lower shelves 56-1 through 56-4 which contain no data processing elements are provided with blank front panels that impede the flow of air.

The ability to control the static pressure and therefore the cooling effect by adding or subtracting openings in the tiles and panels into the cabinets provides a high degree of flexibility not previously achievable. The air flow management system of the invention insures the air cooling is used only to the extent necessary to maintain the equipment in the cabinet within the desired temperature range.

Another advantage of the invention is to reduce the number of fans in the IDC such as the multiple fans located above the cabinets in order to minimize the maintenance cost, increase the management capability of the overall installation and provide a high available environment with redundant system to all the IDC equipment being installed. The cooling mechanism does not rely heavily on those multiple fans but on a highly available pressurized air from under the elevated floor.

We claim:

1. An airflow management system for an Internet Data Center, the Internet Data Center comprising cabinets that contain heat-generating elements, each cabinet having a cabinet front, said cabinets being located on an elevated floor, said cabinets being disposed as a pair of substantially parallel rows of cabinets having a first row of cabinets and a second row of cabinets wherein cabinet fronts of the first row of cabinets face cabinet fronts of the second row of cabinets, said airflow management system comprising:

fresh air generating means for supplying fresh air through the elevated floor for cooling the heat generating elements;

hot air collecting means for collecting hot air that results from cooling the heat generating elements by the fresh air supplied through the elevated floor;

a cover joining the first row of cabinets and the second row of cabinets to provide a tunnel; and means for controlling static pressure in the tunnel by controlling fresh air volume supplied through the elevated floor, in dependence upon heat generated by the heat generating elements.

2. The air flow management system according to claim 1, wherein a region of the elevated floor between the two rows includes perforated tiles adapted to supply the fresh air into the tunnel.

3. The air flow management system according to claim 2, wherein said perforated tiles can be replaced by other perforated tiles having a different percentage of openings in order to adjust said openings according to an optimum need of said tunnel while maintaining the static pressure in said tunnel at a predefined value.

4. The air flow management system according to claim 2, wherein said perforated tiles include shutters which can be manually adjusted in order to modify the percentage of openings while maintaining the static pressure in said tunnel to a predefined value.

5. The air flow management system according to claim 1, wherein each shelf of said cabinets includes a front panel which is a blank panel if said shelf does not contain a heat-generating element and is a perforated panel if said shelf contains, at least one heat-generating element.

6. The air flow management system according to claim 5, wherein static pressure of said fresh air supplied into said tunnels exceeds static pressure of hot air upon exiting said heat generating elements.

7. The air flow management system according to claim 6, wherein said fresh air has a static pressure between 1.2 and 1.4 bar whereas said hot air has a static pressure between 1.1 and 1.2 bar.

8. The air flow management system according to claim 6, wherein said fresh air generating means comprise a heat exchanger for exchanging calories with a cooling fluid.

9. The air flow management system according to claim 8, wherein said hot air collecting means comprises fans for sucking said hot air resulting from fresh air passing through said heat-generating elements and a hot air room wherein said hot air flows towards said heat exchanger.

* * * * *